(12) United States Patent
Lopez-Julia et al.

(10) Patent No.: US 11,177,420 B2
(45) Date of Patent: Nov. 16, 2021

(54) OPTICAL COUPLING LAYER TO IMPROVE OUTPUT FLUX IN LEDS

(71) Applicant: Lumileds LLC, San Jose, CA (US)

(72) Inventors: Antonio Lopez-Julia, Aachen (DE); Jens Meyer, Aachen (DE)

(73) Assignee: Lumileds LLC, San Jose, CA (US)

( * ) Notice: Subject to any disclaimer, the term of this patent is extended or adjusted under 35 U.S.C. 154(b) by 94 days.

(21) Appl. No.: 16/597,455

(22) Filed: Oct. 9, 2019

(65) Prior Publication Data

US 2021/0111316 A1    Apr. 15, 2021

(51) Int. Cl.

| | |
|---|---|
| *H01L 33/50* | (2010.01) |
| *F21S 41/153* | (2018.01) |
| *H01L 33/32* | (2010.01) |
| *H01L 33/30* | (2010.01) |
| *H01L 33/58* | (2010.01) |
| *F21S 41/24* | (2018.01) |
| *H01L 27/15* | (2006.01) |
| *H01L 25/075* | (2006.01) |
| *H01L 25/16* | (2006.01) |
| *F21S 41/275* | (2018.01) |

(52) U.S. Cl.
CPC .......... *H01L 33/507* (2013.01); *F21S 41/153* (2018.01); *H01L 33/30* (2013.01); *H01L 33/32* (2013.01); *H01L 33/58* (2013.01); *F21S 41/24* (2018.01); *F21S 41/275* (2018.01); *H01L 25/0753* (2013.01); *H01L 25/167* (2013.01); *H01L 27/156* (2013.01); *H01L 2933/0041* (2013.01); *H01L 2933/0058* (2013.01); *H01L 2933/0091* (2013.01)

(58) Field of Classification Search
CPC ....... H01L 25/075; H01L 33/46; H01L 33/54; H01L 33/58; H01L 33/62
USPC .......................................................... 257/76
See application file for complete search history.

(56) References Cited

U.S. PATENT DOCUMENTS

| | | | |
|---|---|---|---|
| 8,721,098 B2 | 5/2014 | Bechtel et al. | |
| 8,994,259 B2 | 3/2015 | Tamaki et al. | |
| 2005/0093008 A1 | 5/2005 | Suehiro et al. | |
| 2007/0298250 A1 | 12/2007 | Weimer et al. | |
| 2008/0121917 A1 | 5/2008 | Weisbuch et al. | |
| 2018/0122993 A1* | 5/2018 | Camras | C23C 16/40 |
| 2018/0313501 A1 | 11/2018 | Anc et al. | |
| 2019/0093871 A1 | 3/2019 | Sato et al. | |

(Continued)

FOREIGN PATENT DOCUMENTS

| | | |
|---|---|---|
| WO | 2008007232 A2 | 1/2008 |
| WO | 2019141480 A1 | 7/2019 |

OTHER PUBLICATIONS

Extended European Search Report, EP Application No. 20157448.0, dated Jul. 3, 2020, 14 pages.

(Continued)

*Primary Examiner* — Elias Ullah (57) ABSTRACT

An optical coupling structure is disposed on a light output surface of a semiconductor LED to facilitate coupling of light emitted by the semiconductor LED through the light output surface. The optical coupling structures comprise light scattering particles and/or air voids embedded in or coated with a thin layer of a material that has an index of refraction close to or matching the index of refraction of the material forming the light output surface of the semiconductor LED.

19 Claims, 7 Drawing Sheets

(56) References Cited

U.S. PATENT DOCUMENTS

| | | |
|---|---|---|
| 2019/0169494 A1 | 6/2019 | Nakamura et al. |
| 2019/0198564 A1 | 6/2019 | Tandon et al. |
| 2020/0142288 A1 | 5/2020 | Okuno et al. |
| 2020/0203567 A1 | 6/2020 | Basin et al. |

OTHER PUBLICATIONS

From the EPO as the ISA, "Notification of Transmittal of the International Search Report and the Written Opinion of the International Searching Authority, or the Declaration", corresponding to PCT/US2020/054938, dated Jan. 26, 2021, 20 pages.

\* cited by examiner

OPTICAL COUPLING LAYER TO IMPROVE OUTPUT FLUX IN LEDS

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

SUMMARY

This specification discloses optical coupling structures disposed on the light output surface of a semiconductor LED to facilitate coupling of light emitted by the semiconductor LED through the light output surface, into the external environment or into another optical element or component of a light emitting device. The optical coupling structures comprise light scattering particles and/or air voids embedded in or coated with a thin layer of a material that has an index of refraction close to or matching the index of refraction of the material forming the light output surface of the semiconductor LED.

In one aspect, such an optical coupling structure is disposed in a pcLED between and in contact with the light output surface of the semiconductor LED and the wavelength converting structure (e.g., phosphor layer) to facilitate coupling of light emitted by the semiconductor LED through the light output surface into the wavelength converting structure.

Other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
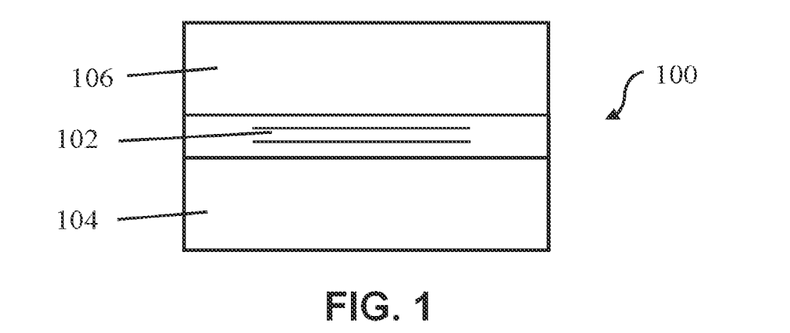
FIG. 1 shows a schematic cross-sectional view of an example pcLED.

FIG. 1 shows an example of an individual pcLED 100 comprising a semiconductor diode structure 102 disposed on a substrate 104, together considered herein an "LED", and a wavelength converting structure (e.g., phosphor layer) 106 disposed on the LED. Semiconductor diode structure 102 typically comprises an active region disposed between n-type and p-type layers. Application of a suitable forward bias across the diode structure results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, and II-VI materials.

Any suitable phosphor materials may be used, depending on the desired optical output from the pcLED.

Figure 2A:
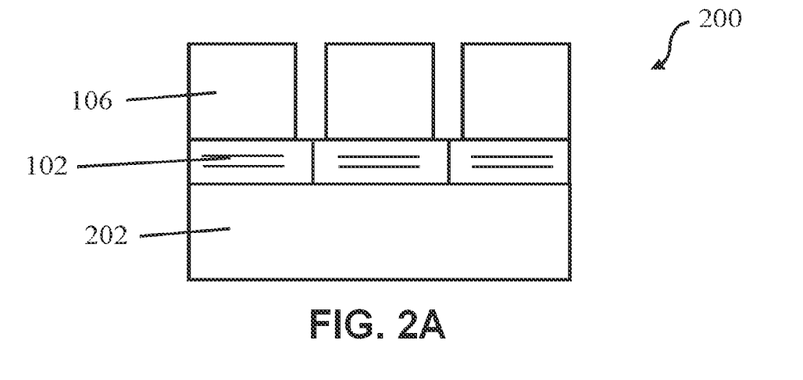
FIGS. 2A and 2B show, respectively, cross-sectional and top schematic views of an array of pcLEDs.
Figure 2B:
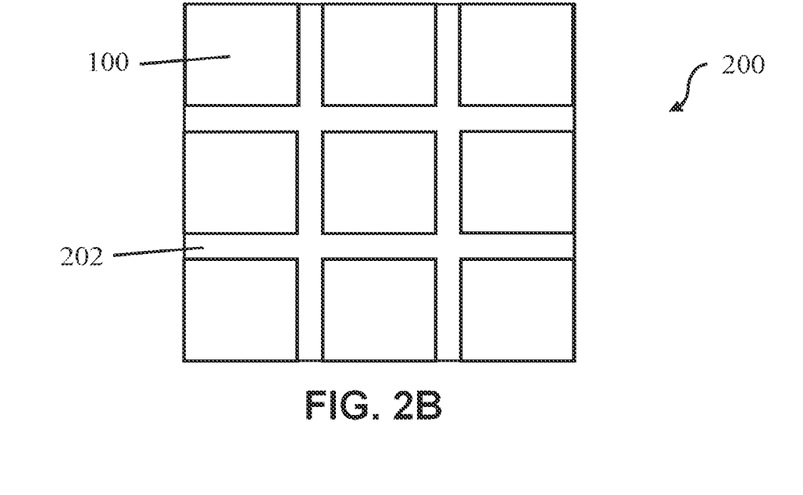

FIGS. 2A-2B show, respectively, cross-sectional and top views of an array 200 of pcLEDs 100, each including a phosphor pixel 106, disposed on a substrate 202. Such an array may include any suitable number of pcLEDs arranged in any suitable manner. In the illustrated example the array is depicted as formed monolithically on a shared substrate, but alternatively an array of pcLEDs may be formed from separate individual pcLEDs. Substrate 202 may optionally comprise CMOS circuitry for driving the LED, and may be formed from any suitable materials.

Figure 3A:
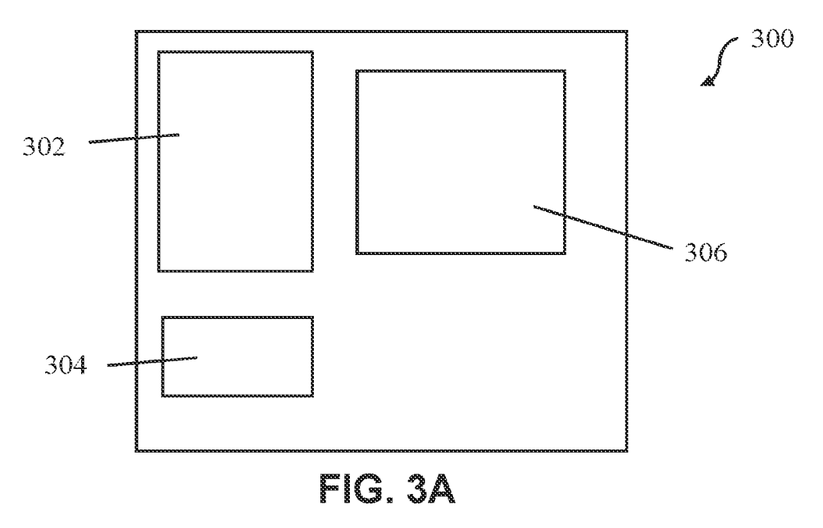
FIG. 3A shows a schematic top view an electronics board on which an array of pcLEDs may be mounted, and FIG. 3B similarly shows an array of pcLEDs mounted on the electronic board of FIG. 3A.
Figure 3B:
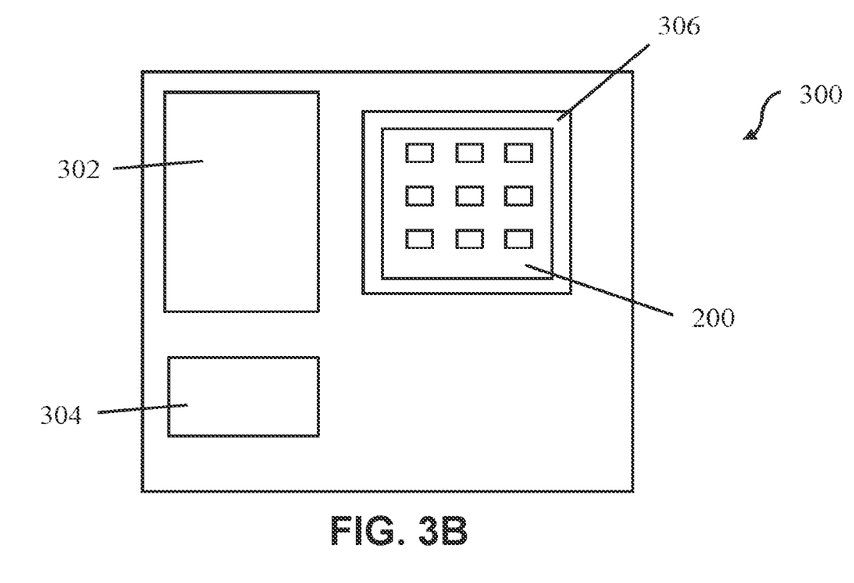

As shown in FIGS. 3A-3B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Figure 4A:
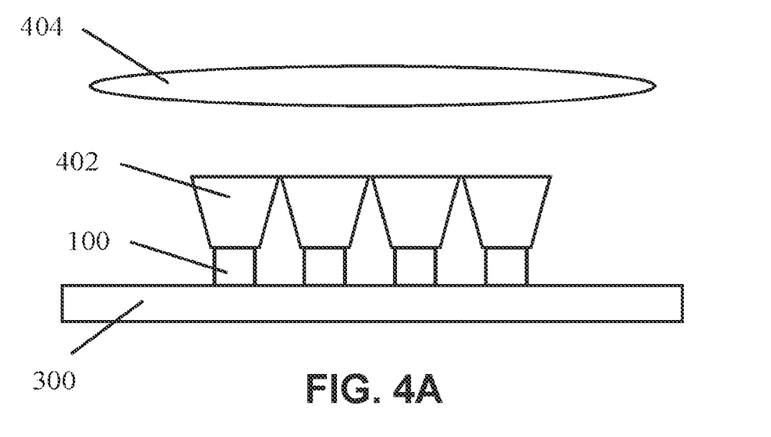
FIG. 4A shows a schematic cross sectional view of an array of pcLEDs arranged with respect to waveguides and a projection lens.
Figure 4B:
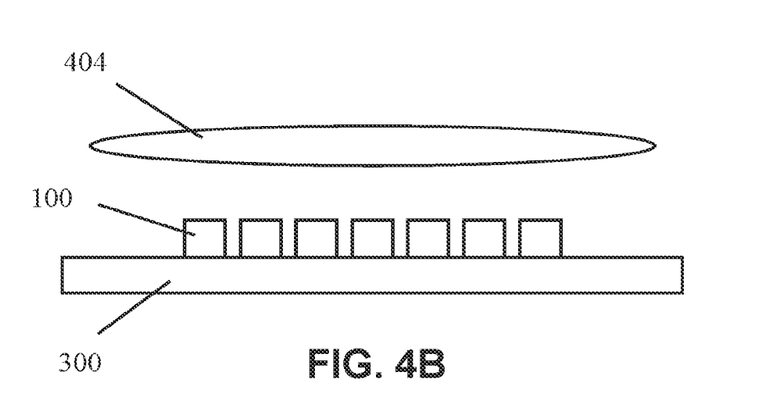
FIG. 4B shows an arrangement similar to that of FIG. 4A, without the waveguides.

Individual pcLEDs may optionally incorporate or be arranged in combination with a lens or other optical element located adjacent to or disposed on the phosphor layer. Such an optical element, not shown in the figures, may be referred to as a "primary optical element". In addition, as shown in FIGS. 4A-4B a pcLED array 200 (for example, mounted on an electronics board 300) may be arranged in combination with secondary optical elements such as waveguides, lenses, or both for use in an intended application. In FIG. 4A, light emitted by pcLEDs 100 is collected by waveguides 402 and directed to projection lens 404. Projection lens 404 may be a Fresnel lens, for example. This arrangement may be suitable for use, for example, in automobile headlights. In FIG. 4B, light emitted by pcLEDs 100 is collected directly by projection lens 404 without use of intervening waveguides. This arrangement may particularly be suitable when pcLEDs can be spaced sufficiently close to each other, and may also be used in automobile headlights as well as in camera flash applications. A microLED display application may use similar optical arrangements to those depicted in FIGS. 4A-4B, for example. Generally, any suitable arrangement of optical elements may be used in combination with the pcLEDs described herein, depending on the desired application.

This disclosure concerns the manufacture and use of an optical coupling structure that improves light extraction and package efficiency in light emitting diodes, for example in phosphor-converted light emitting diodes. In this disclosure, light extraction refers to the coupling of light generated in the semiconductor LED out of the semiconductor LED, for example out of the semiconductor LED and into a wavelength converting structure (e.g., into a phosphor layer). Package efficiency refers to extraction of light out of the wavelength converting structure as the desired output from the pcLED. Package efficiency may be defined, for example, as the ratio of the number of photons output from the pcLED to the number of photons coupled into the wavelength converter from the semiconductor LED.

In III-V (e.g., AlInGaN and AlInGaP) LEDs the coupling of light out of the semiconductor LED into the external environment (e.g., air) or into another optical component (e.g., into a lens or into a wavelength converting structure) may be limited by reflections occurring at the interface between the semiconductor light emitting diode and the external environment or other optical component. Reflections at that interface may be significant, for example, if the output surface of the semiconductor LED is a III-V semiconductor (e.g., GaN, AlN, AlGaN, GaP, AlGaP, AlInGaP) surface having a significantly higher refractive index than the external environment or other optical element. Light reflected at this interface back into the semiconductor LED may be absorbed in the LED.

For example, in III-Nitride pcLEDs the coupling of light from the semiconductor LED into the wavelength converting structure may be limited by reflections occurring at the interface between the semiconductor light emitting diode and the wavelength converting structure. Reflections at that interface may be significant, for example, if the output surface of the semiconductor LED is a surface of a III-Nitride (e.g., GaN, AlN, AlGaN) layer having a high refractive index and the wavelength converting structure has a significantly lower refractive index, as is typically the case for a wavelength converting structure comprising inorganic phosphor particles dispersed in a silicone binder. Light reflected at this interface back into the semiconductor LED may be absorbed in the LED, decreasing overall efficiency of the pcLED.

Further, if the wavelength converting structure is strongly scattering, light coupled into the wavelength converting structure from the semiconductor LED and light emitted in the wavelength converting structure may be scattered back into the semiconductor LED and absorbed. This also decreases overall efficiency of the pcLED.

One conventional approach for increasing the coupling of light out of a semiconductor LED (e.g., into a wavelength converting structure) is to pattern the light output surface of the semiconductor LED with a texture that reduces the amount of light reflected at the semiconductor LED/wavelength converter interface. The patterning may be done for example by growing the semiconductor LED on a patterned sapphire surface, and then separating the patterned sapphire surface from the semiconductor LED. The surface of the semiconductor LED that was in contact with the sapphire surface is patterned with a texture complementary to that of the patterned sapphire surface.

The use of a patterned surface at the semiconductor LED/wavelength converter interface adds manufacturing complexity, and as explained below may be less suitable for micro-LED architectures than for larger dimension devices.

As summarized above, the optical coupling structures described herein are disposed on the light output surface of the semiconductor LED to facilitate coupling of light out of the semiconductor LED. For example, such an optical coupling structure may be disposed between and in contact with the light output surface of a semiconductor LED and a wavelength converting structure to facilitate coupling of light emitted by the semiconductor LED through the light output surface into the wavelength converting structure.

These optical coupling structures comprise light scattering particles embedded in or coated with a thin layer of a material that has a high index of refraction close to or matching the index of refraction of the material forming the light output surface of the semiconductor LED. Generally, the high index material should have a refractive index as high as possible but not higher than, or not significantly higher than, the index of refraction of the semiconductor layer in the LED at the light output surface (for GaN: 2.5, for AlInGaP: 3.4). The high index material may have an index of refraction of 2 to 2.5, for example. The high index material may have an index of refraction differing from that of the LED light output surface by, for example, less than or equal to 5%, less than or equal to 10%, less than or equal to 15%, less than or equal to 20%, or less than or equal to 25%.

The thin layer of high index material may have a thickness of, for example, greater than or equal to 100 nanometers, or greater than or equal to 200 nanometers, and less than or equal to 2 microns, or less than or equal to 5 microns. The layer of high index material may be thinner than the diameter of the scattering particles, in which case the high index material may conformally coat the light scattering particles. Alternatively the layer of high index material may be thicker than the diameter of the light scattering particles, with the light scattering particles embedded in the layer.

The high index material may be or comprise, for example, Titanium Oxide ($TiO_2$), Chromium Oxide ($CrO_2$), Zirconium Oxide ($ZrO_2$), Hafnium Oxide ($HfO_2$), Tantalum Oxide ($TaO_2$), Aluminum Oxide ($Al_2O_3$), or a combination thereof. These materials may be particularly suitable where the semiconductor LED light output surface is formed from a III-Nitride material such as GaN or from an AlInGaP material.

The light scattering particles in the optical coupling structure may be for example, phosphor particles. Alternatively, the light scattering particles may be non-luminescent particles having a lower index of refraction than the high index layer. This disclosure considers small volume voids (e.g., filled with air) in the high index layer to be an example of such non-luminescent low index of refraction light scattering particles. The light scattering particles in the optical coupling structure may comprise a combination of phosphor particles and non-luminescent particles. Phosphor particles in the optical coupling structure may have a diameter of, for example, about 2 microns to about 3 microns, or about 2 microns to about 4 microns, or about 2 microns to about 10 microns and may be formed from doped YAG, for example. Phosphor particles in the optical coupling structure may be of the same type and of the same diameter as phosphor particles in the wavelength converting structure. Any suitable phosphor particles may be used.

Air voids in the high index layer may have a diameter or maximum dimension of less than or equal to about 1 micron, for example about 200 nanometers.

The overall thickness of optical coupling structure 505, measured perpendicularly to the semiconductor LED light output surface, may be for example greater than or equal to 200 nanometers, or greater than or equal to 1 micron, and less than or equal to 2 microns or less than or equal to 5 microns.

The high index material in the optical coupling structure, index matched or nearly indexed matched to the semiconductor LED output surface, puts the scattering particles in the optical coupling structure in optical contact with the semiconductor LED output surface with no intervening significantly reflective interface between the scattering particles and the semiconductor LED. This enables the scattering particles to play a role similar to conventional texturing of a semiconductor LED output surface, coupling light out of the semiconductor LED and (and, for example, into a wavelength converting structure) and thereby enhances extraction efficiency. For a pcLED, this is analogous to having the semiconductor LED output surface material (e.g., GaN) extend into the wavelength converting structure.

Further, for a pcLED, light scattered in the wavelength converting structure toward the semiconductor LED, in which it might be absorbed, is incident on the optical coupling structure. The scattering particles in the optical coupling structure scatter at least a portion of this light back into wavelength converting structure. This enhances package efficiency.

In LEDs and pcLEDs comprising an optical coupling structure as described herein, the semiconductor LED light output surface may be patterned, or not patterned. If patterned, the patterning may be micron scale or nanometer scale. Generally, the absence of patterning on the light output surface will not limit performance of the pcLED, because the optical coupling layer is present. An unpatterned light output surface may be preferred, because epi growth on planar (e.g., unpatterned sapphire) substrates may enable thinner epi and hence higher extraction efficiency by way of reducing die/epi absorption losses. Further, index matching between the optical coupling layer and the patterned light output surface of the semiconductor LED makes the patterning on the light output surface optically ineffective.

The optical coupling structures described herein are generally applicable to pcLEDs of various architectures, but may be particularly suitable for micro-LED architectures due to their specific challenges, such as:

poor extraction efficiency due to high die losses;

poor extraction efficiency due to the need for thinner epi motivated, for example, by a reduction of die/epi losses and/or the need of reducing the size of the surface texture conventionally used to maximize extraction efficiency down to the nanometer scale in order to enable suitable surface post-processes (e.g. deposition of interposer grid on GaN surface);

poor package efficiency (highly scattering converter requirements);

light generated in high refractive index layer (e.g., GaN) must be extracted into phosphor layer whose matrix material is usually significantly lower (high index contrast).

Examples of the optical coupling structure are described below with respect to FIG. 5-FIG. 8. In these examples, a pcLED 100 comprises a semiconductor LED 102, a wavelength converting structure (e.g., phosphor layer) 106, and an optical coupling structure 505. Semiconductor LED 102 comprises a light-emitting active region 102a disposed between semiconductor layer (or layers) 102B and semiconductor layer (or layers) 102C. During operation, light emitted in active region 120A is transmitted through layers 102C, incident on and transmitted through light output surface 102D, and coupled into wavelength converting structure 106 by optical coupling structure 505. Semiconductor LED 102 may be a III-Nitride semiconductor LED, in which case light output surface 102D may be a GaN surface, for example. The example optical coupling structures may similarly be employed on the light output surface of an LED without a wavelength converting structure.

Figure 5:
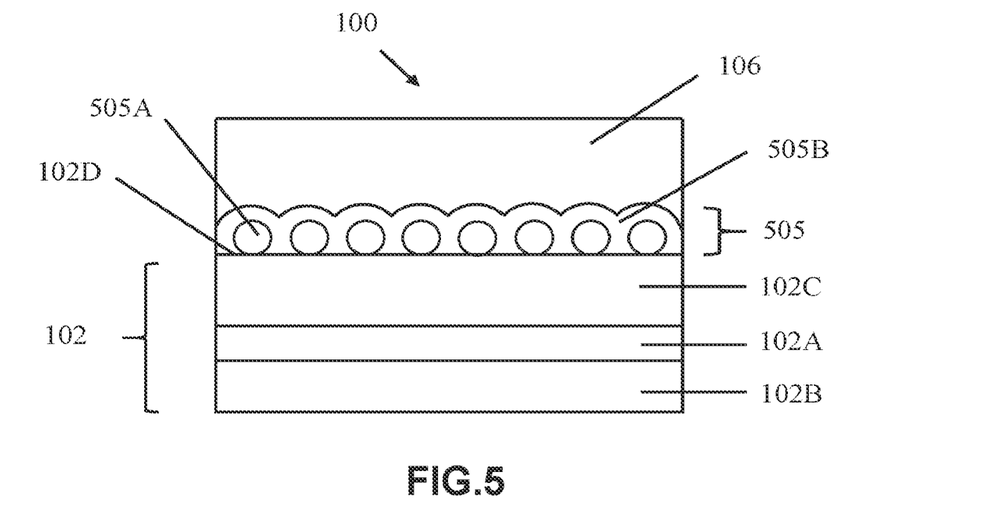
FIG. 5 shows a schematic cross-sectional view of an example pcLED comprising a semiconductor LED, a wavelength converting structure, and an optical coupling structure disposed between the semiconductor LED and the wavelength converting structure.

In the example of FIG. 5, optical coupling structure 505 comprises a single layer of light scattering particles 505A conformally coated with a thin layer 505B of high refractive index material. Layer 505B is index matched, or approximately index matched, to the material of surface 102D, and puts scattering particles 505A in good optical contact with surface 102D and in good optical contact with wavelength converting structure 106. Light scattering particles 505A may be phosphor particles, and may be the same as phosphor particles in wavelength converting structure 106. Particles 505A may have diameters of, for example, about 2 microns to about 4 microns. Layer 505B may have a submicron thickness, for example. Layer 505B may comprise air void regions (not shown in FIG. 5 or 6) to further promote scattering. In this and the following examples, if light output surface 102D is a surface of a GaN layer, high refractive index material 505B may preferably be $TiO_2$, for example.

Figure 6:
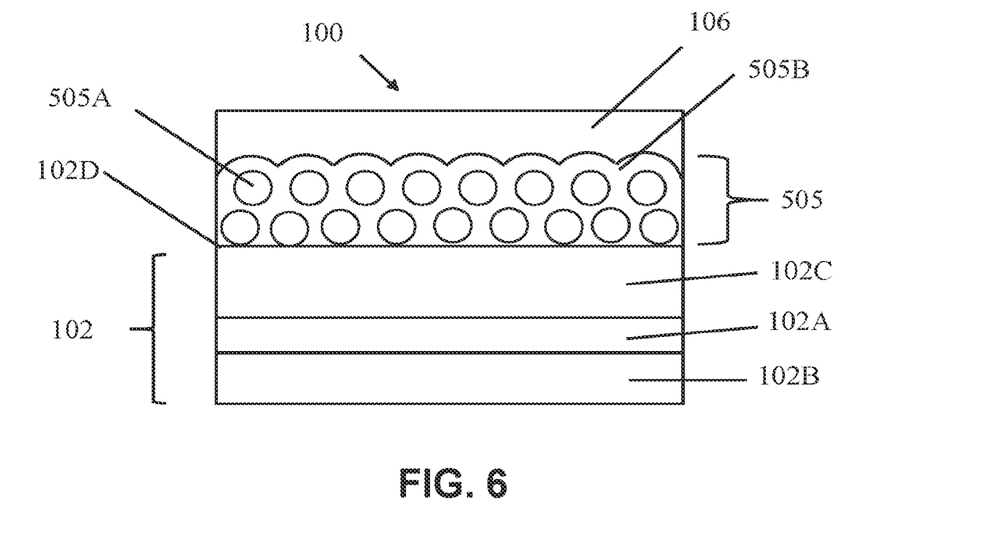
FIG. 6 shows a schematic cross-sectional view of another example pcLED comprising a semiconductor LED, a wavelength converting structure, and an optical coupling structure disposed between the semiconductor LED and the wavelength converting structure.

As shown in the embodiment illustrated in FIG. 6, layer 505B may be thick enough to contain multiple layers of scattering particles (e.g., phosphor grains and/or voids). The resulting optical coupling structure 505 should not be so thick as to fulfill the entire wavelength converter function because the high refractive index matrix of layer 505B would not allow the most efficient conversion in the phosphor particles.

Figure 7:
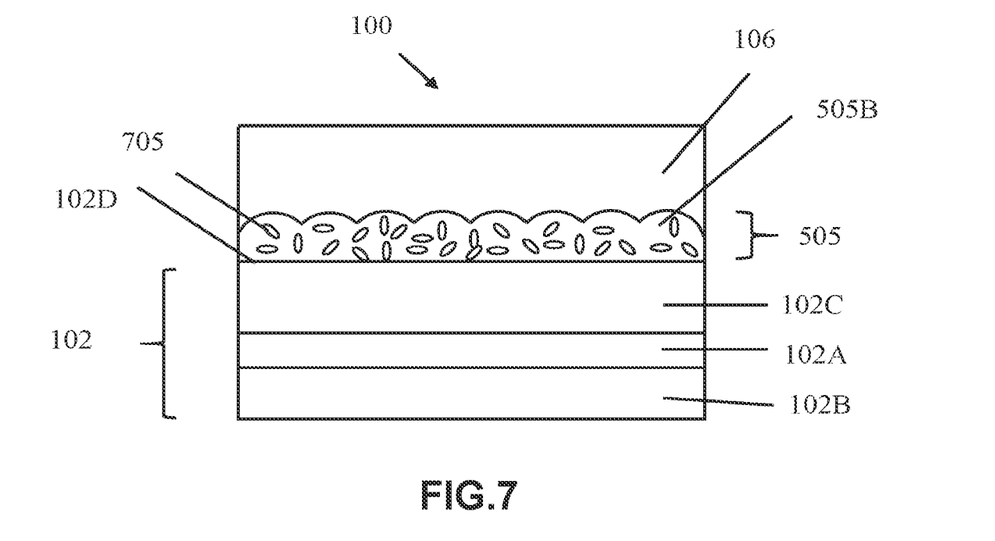
FIG. 7 shows a schematic cross-sectional view of another example pcLED comprising a semiconductor LED, a wavelength converting structure, and an optical coupling structure disposed between the semiconductor LED and the wavelength converting structure.

The embodiment of FIG. 7 illustrates the case where the coupling layer contains air voids 705 as scattering particles instead of or in addition to phosphor grains. These air voids should be nanometer scale (e.g. 200 nanometer diameter).

Figure 8:
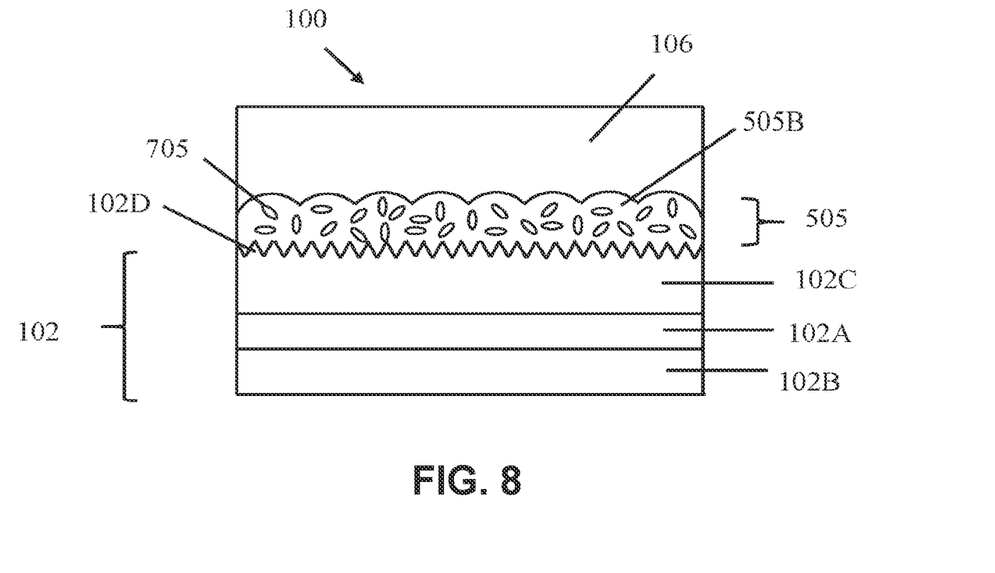
FIG. 8 shows a schematic cross-sectional view of another example pcLED comprising a semiconductor LED, a wavelength converting structure, and an optical coupling structure disposed between the semiconductor LED and the wavelength converting structure.

As noted above, the semiconductor LED light output surface may optionally be patterned, though this is not necessary. FIG. 8 shows an embodiment as in FIG. 7, but with surface 102D patterned. The patterning may be micron scale or nanometer scale. Also as noted above, an unpatterned light output surface does not limit performance, due to the presence of optical coupling layer 505 which serves as alternative to promoting high light out-coupling. Epi growth on planar substrates or nano-patterned sapphire substrates may enable thinner epi and hence higher extraction efficiency by way of reducing die/epi absorption losses.

Figure 9A:
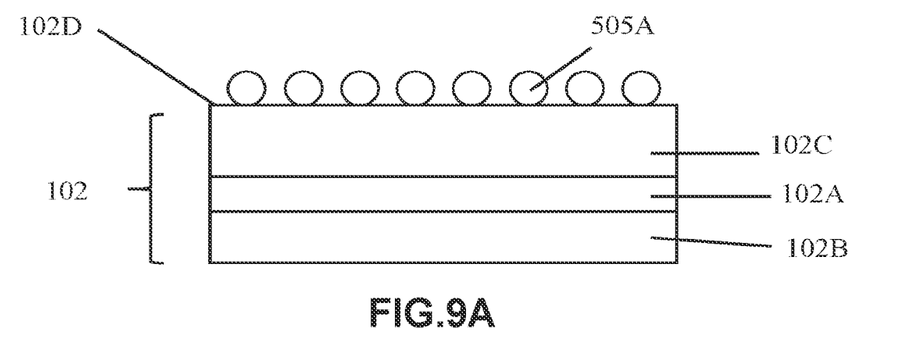
FIG. 9A, FIG. 9B, and FIG. 9C schematically illustrate steps in a method for manufacturing the example pcLED of FIG. 5.
Figure 9B:
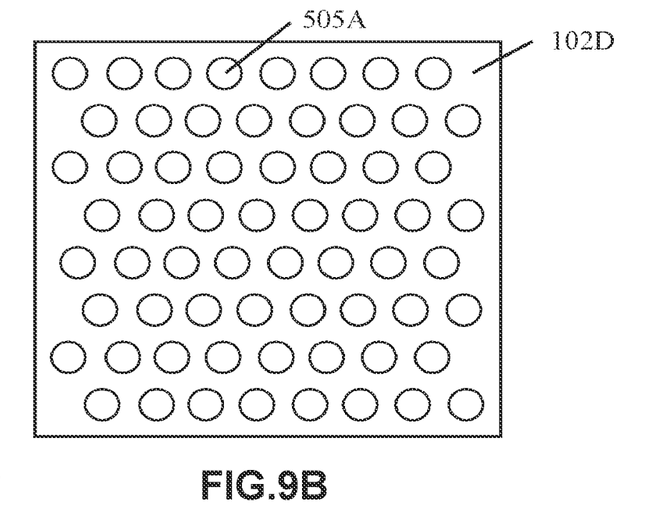
Figure 9C:
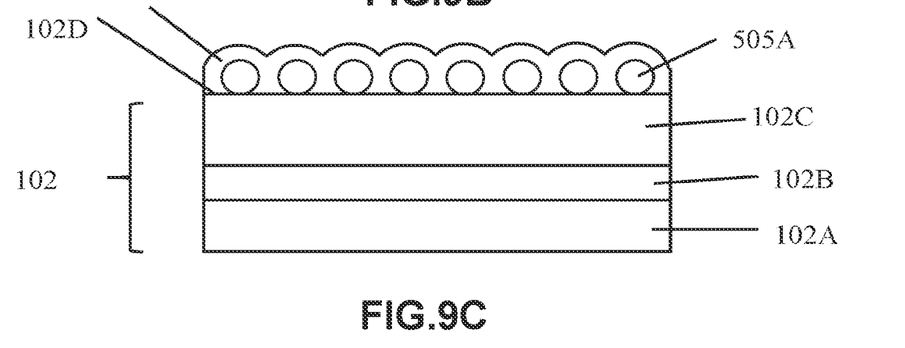

FIG. 9A-9C schematically illustrate manufacturing a pcLED as in FIG. 5. In the cross-sectional view of FIG. 9A, a single layer of phosphor particles 505A is deposited on light output surface 102D of semiconductor LED 102. This may be done in any conventional manner, for example by sedimentation. FIG. 9B shows a top vie of phosphor particles 505A disposed on surface 102D. Although for convenience of illustration the particles are shown arranged in a hexagonal array, any suitable arrangement may be used and the arrangement need not be ordered.

Referring now to FIG. 9C, high index of refraction material 505B may be deposited by Atomic Layer Deposition (ALD), for example. Deposition by ALD provides a good optical connection between the particles 505A and surface 102D. ALD is a pulsed chemical vapor deposition (CVD) process which allows the growth of thin layers by applying one atomic layer of a material per cycle. Such process is self-limiting allowing very controlled and conformal coatings even on particles as shown in FIG. 9C. The ALD reaction is split in (at least) two parts. In a first step a metal (oxide) precursor is fed into the reactor and adsorbs and/or reacts with reactive groups on the surfaces and substantially all non-reacted or adsorbed precursor molecules are removed by reactor purging. In a second step an oxygen source is fed into the reactor and reacts with the metal source on the particle surfaces followed by purging of the reactor to remove substantially all remaining oxygen source molecules and hydrolysis products formed by condensation reactions. The two steps lead to formation of an atomic layer (or monolayer) of metal oxide because of the self-limiting nature of the surface reaction. These atomic layer reaction steps are repeated multiple times to form the final ALD coating.

Voids (e.g., as shown in FIG. 7 and FIG. 8) can be embedded in the intermediate coupling layer by allowing partial CVD process reaction.

The term metal oxide precursor especially indicates a precursor of the metal oxide. The precursor itself need not be a metal oxide, but may for example include metal organic molecules. Hence, especially the metal (oxide) precursors for ALD may typically include metal halides, alkoxides, amides, and other metal (organic) compounds. A TiOx layer may be deposited by using one of the following precursors $TiCl_4$, $Ti(OCH_3)_4$ or $Ti(OEt)_4$ at a growth temperature between 80° C. and 250° C. The oxygen source may be $H_2O$, ozone, or oxygen plasma.

In another embodiment a thin $Al_2O_3$ layer is added on top of the $TiO_2$ layer. The $Al_2O_3$ layer may be deposited by using $Al(CH_3)_3$ (TMA), $AlCl_3$ or $HAl(CH_3)_2$ precursor in combination with an oxygen source. As noted above, in alternative embodiments the $TiO_2$ layer may be replaced by another high index material such $SnO_2$, $CrO_2$, $ZrO_2$, $HfO_2$, $Ta_2O_5$ or a combination of such materials by forming a multilayer structure.

In a further step, not shown, a wavelength converting structure 106, for example phosphor particles dispersed in a binder matrix, is disposed on optical coupling layer 505. Typically the matrix in the wavelength converter has a lower index of refraction than that of high index material 505B. The matrix may be or comprise, for example, silicone, silicone with air voids, or a metal oxide comprising air voids.

Figure 10:
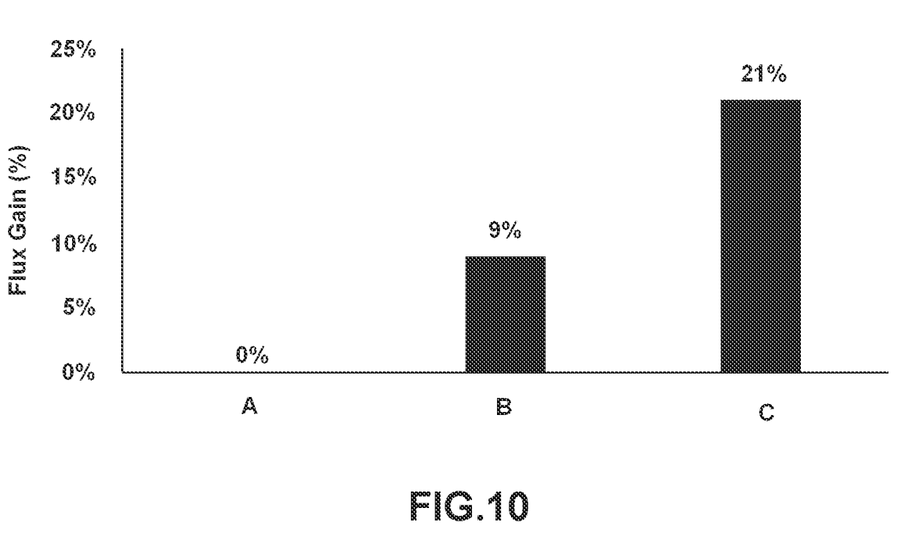
FIG. 10 is a plot comparing the output flux from two reference case pcLEDs to the output flux a pcLED comprising an example optical coupling layer as described herein.

FIG. 10 is a plot comparing the performance (output flux) of two reference case pcLEDs (A and B) to a pcLED (C) comprising an example optical coupling layer as described herein. In all three cases, the pcLED has a 40 micron die size and comprises a 10 micron thick phosphor layer disposed on a III-Nitride LED. The phosphor layer comprises 3 micron diameter Ce doped YAG particles immersed in an Aluminum Oxide matrix with 10% air voids. All three cases target a color of v'=0.473, u'=0.21.

In case A the light output surface of the semiconductor LED is not patterned (not grown on a patterned sapphire substrate) and the device does not include an optical coupling layer between the semiconductor LED and the phosphor layer.

Case B is the same as case A, except the light output surface of the semiconductor LED is patterned (grown on a patterned sapphire substrate). Case B exhibits a 9% flux gain compared to case A.

In case C the semiconductor LED light output surface is not patterned, as in case A. The phosphor layer is the same as in case A and case B, except for being 6 microns thick rather than 10 microns thick. The device of case C includes an optical coupling layer as taught herein disposed between the semiconductor LED and the phosphor layer. The optical coupling layer is 4 microns thick, and comprises 3 micron diameter Ce doped YAG particles embedded in a Titanium Oxide layer index matched, or approximately index matched, to the semiconductor LED light output surface. Case C exhibits a 21% flux gain compared to case A. The use of the optical coupling layer avoids the need of PSS while still offering large gains compared to the reference case using the patterned sapphire substrate (i.e., a flux gain >10% compared to case B).

This disclosure is illustrative and not limiting. Further modifications will be apparent to one skilled in the art in light of this disclosure and are intended to fall within the scope of the appended claims.

The invention claimed is:
1. A light emitting device comprising:
   a semiconductor light emitting diode having a light output surface;
   an optical coupling structure disposed on the light output surface, the optical coupling structure comprising a plurality of light scattering particles coated with or embedded in a layer of transparent material; and a wavelength converting structure having a composition that differs from the optical coupling structure, the optical coupling structure being disposed between the light output surface and the wavelength converting structure and being in physical contact with the wavelength converting structure, the layer of transparent material being in physical contact with the light output surface and having an index of refraction matching or approximately matching an index of refraction of the light output surface.

2. The light emitting device of claim 1, the light output surface being a GaN, AlN, or AlGaN alloy material surface.

3. The light emitting device of claim 1, the light output surface being a GaP, AlGaP, or AlInGaP alloy material surface.

4. The light emitting device of claim 1, the light scattering particles comprising phosphor particles.

5. The light emitting device of claim 1, the scattering particles in the optical coupling structure being arranged in a layer that is only one particle thick that is disposed on or adjacent the light output surface.

6. The light emitting device of claim 1, the light scattering particles comprising voids in the layer of transparent material.

7. The light emitting device of claim 1, the light scattering particles comprising phosphor particles and voids in the layer of transparent material.

8. The light emitting device of claim 1, the wavelength converting structure comprising phosphor particles dispersed in a matrix, the index of refraction of the layer of transparent material in the optical coupling structure being greater than an index of refraction of the matrix.

9. The light emitting device of claim 1, the layer of transparent material having a thickness greater than or equal to 100 nanometers and less than or equal to 5 microns.

10. The light emitting device of claim 1:
the light scattering particles comprising phosphor particles; and
the wavelength converting structure comprising phosphor particles dispersed in a matrix having an index of refraction less than the index of refraction of the layer of transparent material in the optical coupling structure.

11. The light emitting device of claim 10, the phosphor particles in the wavelength converting structure being of a same composition and size as the phosphor particles in the optical coupling structure.

12. The light emitting device of claim 11, the transparent material being or comprising a metal oxide.

13. The light emitting device of claim 12, the layer of transparent material having a thickness greater than or equal to 100 nanometers and less than or equal to 5 microns.

14. The light emitting device of claim 13, the phosphor particles having a diameter of about 2 microns to about 4 microns.

15. A method for making a light emitting device, the method comprising:
forming on a light output surface of a semiconductor light emitting diode an optical coupling structure comprising light scattering particles coated by or embedded in a layer of transparent material that has an index of refraction matching or approximately matching an index of refraction of the light output surface and is in physical contact with the light output surface; and
disposing on the optical coupling structure a wavelength converting structure having a composition that differs from the optical coupling structure, the optical coupling structure being disposed between the light output surface and the wavelength converting structure and being in physical contact with the wavelength converting structure.

16. The method of claim 15, the wavelength converting structure comprising phosphor particles dispersed in a matrix material that has an index of refraction less than the index of refraction of the layer of transparent material in the optical coupling structure.

17. The method of claim 15:
the layer of transparent material in the optical coupling structure comprising a metal oxide and the scattering particles in the optical coupling structure comprising phosphor particles disposed on or adjacent the light output surface; and
forming the optical coupling structure comprising (i) disposing the phosphor particles on or adjacent the light output surface of the semiconductor light emitting diode and (ii) depositing the metal oxide on the light output surface and on the phosphor particles disposed on the light output surface by atomic layer deposition.

18. The method of claim 15:
the layer of transparent material in the optical coupling structure comprising a metal oxide and the scattering particles in the optical coupling structure comprising voids in the layer of transparent material; and
forming the optical coupling structure comprising (i) depositing the metal oxide on the light output surface by atomic layer deposition and (ii) embedding the voids in the transparent layer by allowing incomplete reaction during the atomic layer deposition process.

19. The method of claim 15, the scattering particles in the optical coupling structure being arranged in a layer that is only one particle thick that is disposed on or adjacent the light output surface.

* * * * *